United States Patent [19]
Kudoh et al.

[11] Patent Number: 5,223,729
[45] Date of Patent: Jun. 29, 1993

[54] SEMICONDUCTOR DEVICE AND A METHOD OF PRODUCING THE SAME

[75] Inventors: Chiaki Kudoh, Hirakata; Akito Uno, Yawata; Mikio Nishio, Moriguchi, all of Japan

[73] Assignee: Matsushita Electric Industrial Co., Ltd., Osaka, Japan

[21] Appl. No.: 764,891

[22] Filed: Sep. 24, 1991

[30] Foreign Application Priority Data

Sep. 26, 1990 [JP] Japan ............................ 2-258050

[51] Int. Cl.$^5$ ...................... H01L 29/68; H01L 21/44
[52] U.S. Cl. ...................................... 257/296; 257/308; 437/189; 437/193; 437/233; 437/245; 437/919
[58] Field of Search ................ 357/23.6, 51, 59, 68; 437/189, 193, 233, 245, 919

[56] References Cited

U.S. PATENT DOCUMENTS

5,095,346  3/1992  Bae et al. ........................... 357/23.6
5,100,822  3/1992  Mitani ............................... 357/23.6

OTHER PUBLICATIONS

Yoshikawa et al,-Extended Abstracts of 16th (1984 International Conference on Solid Devices and Materials) Kobe 1984, pp. 475-478.

*Primary Examiner*—Edward Wojciechowicz
*Attorney, Agent, or Firm*—Ratner & Prestia

[57] ABSTRACT

A semiconductor device in which a shortage node of a storage capacitor in a memory cell has rounded edges in cross section and a method of producing the same. A breakdown of a dielectric film in the vicinity of the rounded edges of the storage node is prevented, because electric field concentrations in the vicinity of edges of a storage node is relaxed by rounded shapes of the storage node.

10 Claims, 9 Drawing Sheets

SEMICONDUCTOR DEVICE AND A METHOD OF PRODUCING THE SAME

BACKGROUND OF THE INVENTION

1. Field of the Invention

The present invention relates to a semiconductor device and a method of fabricating the same.

2. Description of the Prior Art

In recent years, the development of semiconductor devices in which numerous elements are integrated at a high density on a semiconductor chip has been actively under way. For the memory cell of the dynamic random access memory (DRAM), there have been proposed various structures suitable for miniaturization of the device.

Presently, the preferred memory cell from the standpoint of minimum area is the one transistor and one capacitor cell. In such a memory cell, signal charge is stored in the storage node of the capacitor (storage capacitor) connected to the transistor (switching transistor).

The storage node of the memory cell is required to have a surface area larger than a prescribed value. Therefore, further progress in the miniaturization of the memory cell makes it imperative for a storage node having a relatively large surface area to be formed within a small, restricted region on a semiconductor substrate.

The stacked memory cell in which the storage node is formed above a silicon substrate is suitable for higher integration of memory cells and has the advantage of being less likely to cause soft errors. Furthermore, the stacked memory cell has an advantage compared to the trench type memory cell having a trench capacitor in that the former is relatively easy to fabricate and suitable for mass production.

For the stacked memory cells, there has been proposed, for example, a memory cell having a fin structure (T, Ema et. al., "3-DIMENSIONAL SPARKED CAPACITOR CELL FOR 16M AND 64M DRAMS", IEEE International Electron Device Meeting Technical Digest, p.592-595, December 1988). The memory cell has a structure in which the surface area of the storage node is larger than the area on the substrate occupied by the memory cell.

Referring to FIGS. 5A to 5E, we will now describe a prior art semiconductor device having the above-mentioned fin structure. FIG. 5A shows in cross section a fragmentary portion of a p-type substrate 1 on which a switching transistor 50 is formed. The switching transistor 50 is an n-type MOSFET having n-type impurity diffusion layers 4 and a word line 3 that also serves as the gate electrode of the switching transistor 50. The switching transistor 50 is electrically isolated from other switching transistors (not shown) by an isolation oxide 2 formed on the p-type substrate 1.

An insulating layer 5-A is deposited by a CVD technique on isolation oxide 2 in such a manner as to cover the switching transistor 50, after which an $Si_3N_4$ film 5-B, a first silicon oxide film 6-A, a first silicon film 7-A, and a second silicon oxide film 6-B are deposited in this order on top of the $Si_3N_4$ film 5-B starting from the side of the P-type substrate 1.

A contact window 8 is formed in the multilayer structure comprising the above-mentioned films, as shown in FIG. 5B. Thereafter, a second silicon film 7-B is deposited on top of the second silicon oxide film 6-B in such a manner as to contact the n-type impurity diffusion layer 4 of the switching transistor 50 through the contact window 8, as shown in FIG. 5C.

Next, after patterning the second silicon film 7-B by an anisotropic etching technique with a resist mask 9, the second silicon oxide film 6-B is etched away. Also, after patterning the first silicon film 7-A, the first silicon oxide film 6-A is etched away (FIG. 5D), thus forming a storage node 10 having a fin structure. Then, a dielectric film 11 and a cell plate 12 are formed in this order on top of the storage node 10, to form a storage capacitor as shown in FIG. 5E. After the storage capacitor is formed, a bit line 13 is formed to interconnect the switching transistor 50 to the periphery circuit (not shown).

The storage node 10 of the prior art semiconductor memory device has sharp edges in cross section perpendicular to the top surface of the p-type substrate 1, as shown in FIG. 6A. Each of the sharp edges is constituted by two faces of many faces of the storage node 10. One of the two faces is formed by isotropic etching and is substantially perpendicular to the top surface of the p-type substrate 1, and the other is substantially parallel to the top surface of the p-type substrate 1.

Due to the existence of the sharp edges of the storage node 10, electric field concentrations occur in the vicinity of the shape edges. The electric field concentrations cause the dielectric film 11 to break down at a low voltage applied between the storage node 10 and the cell plate 12. Especially, when the dielectric film 11 is an oxide film which is formed by oxidizing the surface of the storage node 10 in an oxidizing ambient with a temperature of about 850° C. or more, the edges become sharper due to a hone effect which occurs during oxidizing the shape edges. This hone effect is referred to in detail in Extended Abstracts of the 16th (1984) International Conference on Solid State Devices and Materials, Kobe, 1984, pp.475-478.

FIG. 6B schematically shows the electric field concentration in the vicinity of a sharp edge of the storage node 10. The degree of the electric concentration, i.e., the ratio of a peak value of an electric field strength ($E_{EDGE}$) in the vicinity of the edge to an electric field strength ($E_{FLAT}$) in a flat region of the storage node 10, is dependent upon the angle ($\theta$) of the edge. The relationship between the ratio ($E_{EDGE}/E_{FLAT}$) and the angle ($\theta$) of the edge is shown in FIG. 7. This relationship was obtained by calculation. As shown in FIG. 7, the smaller the angle ($\theta$) is, the greater the ratio ($E_{EDGE}/E_{FLAT}$) is.

FIGS. 8A through 8C schematically show cross sectional features of the storage node 10 in memory cells having different sizes. As shown in FIGS. 8A through 8C, as the size of the memory cell becomes smaller, the angle of the edges become smaller ($\theta_1 > \theta_2 > \theta_3$).

In order to reduce the device dimensions without reducing the capacitance of the storage capacitor, it is required to use a stacked capacitor structure having a thinner dielectric film. However, in the prior art devices, an increase in the number of sharp edges of the storage node and a decrease in the thickness of the dielectric film cause the dielectric film to easily break down at a lower voltage.

SUMMARY OF THE INVENTION

The semiconductor device according to the invention, which overcomes the above-discussed and numerous other disadvantages and deficiencies of the prior art, comprises: a semiconductor substrate having a top surface, and a plurality of memory cells formed on said top surface of said semiconductor substrate, each of said plurality of memory cells including a storage capacitor formed over said top surface of said semiconductor substrate, and said storage capacitor comprises: a first electrode having rounded edges in a cross section which is perpendicular to said top surface of said semiconductor substrate, a dielectric film formed on said first electrode, said dielectric film covering said rounded edges; and a second electrode formed on said dielectric film.

In a preferred embodiment, the radius of curvature of said rounded edges is four or more times the thickness of said dielectric film.

In a preferred embodiment, said first electrode comprises an inner conductive portion and a conductive film covering said inner conductive portion, said rounded edges are made of said conductive film.

In a preferred embodiment, said conductive film of said first electrode is a film deposited on said inner conductive portion by a chemical vapor deposition method.

In a preferred embodiment, said conductive film is a doped polycrystalline silicon film.

In a preferred embodiment, said first electrode comprises a first conductive portion having side faces substantially perpendicular to said top surface of said semiconductor substrate, and a second conductive portion formed on said side faces of said first conductive portion.

According to the invention, a method of fabricating a semiconductor device is provided, comprising a semiconductor substrate having a top surface, and a plurality of memory cells formed on said top surface of said semiconductor substrate, each of said plurality of memory cells including a storage capacitor formed over said top surface of said semiconductor substrate, said method comprises the steps of: forming a first electrode having rounded edges in a cross section which is perpendicular to said top surface of said semiconductor substrate; forming a dielectric film on said first electrode, for covering said rounded edges; and forming a second electrode on said dielectric film, thereby forming said storage capacitor which comprises said first electrode, said dielectric film, and said second electrode.

In a preferred embodiment, said step of forming said first electrode comprises the steps of: forming a multilayer structure over said top of said semiconductor substrate, said multilayer structure including at least one insulating film and conductive films sandwiching said insulating film; patterning said multilayer structure by a selective etching technique; removing said insulating film by an etching technique, for forming an electrode; and etching edges of said electrode by an etching technique, thereby forming said first electrode having said rounded edges.

In a preferred embodiment, said step of forming said first electrode comprises the steps of: forming a multilayer structure over said top of said semiconductor substrate, said multilayer structure including at least one insulating film and conductive films sandwiching said insulating film; patterning said multilayer structure by a selective etching technique; removing said insulating film by an etching technique; for forming in inner conductive portion of said first electrode; and forming a conductive film on said inner conductive portion, for covering said inner conductive portion, thereby forming said electrode having said rounded edges.

In a preferred embodiment, said step of forming said first electrode comprises the steps of: forming a multilayer structure over said top of said semiconductor substrate, said multilayer structure including at least one insulating film and conductive films sandwiching said insulating film; patterning said multi layer structure by a selective etching technique; removing said insulating film by an etching technique, for forming an electrode; oxidizing a surface of said electrode, for forming an oxide film; and removing said oxide film by an etching technique, thereby forming said first electrode having said rounded edges.

Thus, the invention described herein makes possible the objective of providing a semiconductor device in which a dielectric film of a storage capacitor is not likely to break down in the vicinity of edges of a storage node of the storage capacitor and a method of producing the same.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

EXAMPLE 1

Referring to FIGS. 1A through 1F, a semiconductor device according to the present invention is described.

Figure 1A:
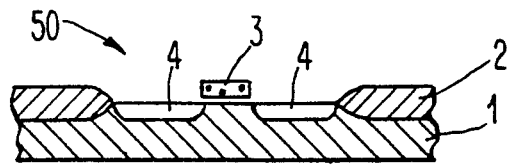
FIGS. 1A to 1F illustrate steps of fabricating a semiconductor device according to the invention.

FIG. 1A shows in cross section a fragmentary portion of a p-type silicon substrate 1 on which a switching transistor 50 was formed. Although only a single memory cell is shown in the figures for simplicity, the p-type silicon substrate 1 was provided with a plurality of memory cells. The p-type silicon substrate 1 was also provided with a LOCOS field oxide (about 400 nm thick) 2 for device isolation.

The switching transistor 50 was an n-type MOSFET having n-type impurity diffusion layers 4 and a word line 3 that also served as the gate electrode. The word line 3 as made of a P-doped polysilicon (phosphorous-doped polycrystalline silicon). The n-type impurity diffusion layers 4 were formed in the p-type silicon substrate 1 by implanting P ions and As ions with self-aligned to the word line 3.

After a BPSG film 5-A as an insulating layer was deposited by an atmospheric-pressure CVD technique on the LOCOS field oxide 2 in such as manner as to cover the switching transistor 50, the top surface of the BPSG film 5-A was softened so as to be planerized by a thermal reflow process. After an SiN film (thickness: about 20 nm) 5-B as an insulating layer was deposited on the BPSG film 5-A by a CVD technique, a first oxide film (P-doped silicon dioxide film) 6-A, a first conductive film (P-doped polysilicon film) 7-A, a second oxide film (P-doped silicon dioxide film) 6-B are successively deposited by a CVD technique in this order on the insulating film 5-A starting from the side of the substrate 1, thus forming a multilayer structure 80.

Figure 1B:
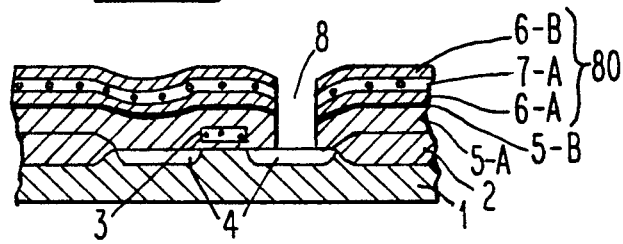
Figure 1C:
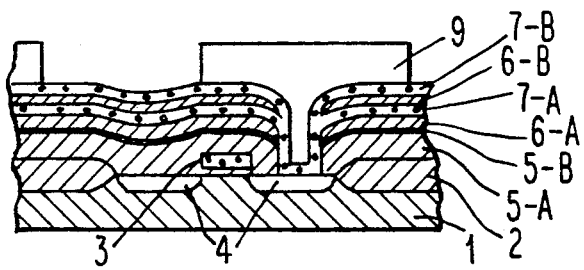

A photoresist mask layer for defining contact window pattern was formed by a photolithography technique on the multilayer structure 80, which was followed by an etching process. In the etching process, a highly anisotropic dry etching was performed using a reactive ion etching (RIE) method, thereby forming a contact window 8 in the multilayer structure 80, reaching down to the n-type impurity diffusion layer 4 of the switching transistor 50, as shown in FIG. 1B. To describe the above etching process in detail, mixed etching gases including $CHF_3$ and $O_2$ were used to etch the first oxide film 6-A and second oxide film 6-B, and mixed gases including HBr and HCl were used to etch the first conductive film 7-A.

Thereafter, a second conductive film (P-doped polysilicon film) 7-B was formed on the multilayer structure 80 in such a manner as to bury the contact window 8. A photoresist mask layer 9 for defining the storage node pattern was formed by a photolithography technique on the second conductive film 7-B, which was followed by an etching process. In the etching process, a highly anisotropic dry etching was performed using the RIE. To describe the above etching process in detail, etching gases including HBr as a main gas was used to anisotropically etch the second conductive film 7-B and the first conductive film 7-A under a reactive ion etching condition. Mixed gases including $CHF_3$ and $O_2$ were used to anisotropically etch the first oxide film 5-A and the second oxide film 6-B under a reactive ion etching condition.

Figure 1D:
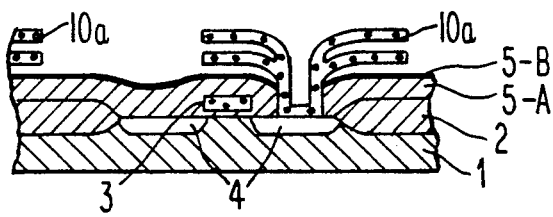

After the anisotropic dry etching, the first oxide film 6-A and a second oxide film 6-B which were left between the first conductive film 7-A and the second conductive film 7-B were removed by an isotropic etching technique using an HF type etchant, thereby forming a storage node 10a as shown in FIG. 1D. At this stage, the storage node 10a had sharp edges.

In this embodiment, the P-doped polysilicon films were used for the first and second polysilicon films 7-A and 7-B, because a polysilicon film has a good step coverage and can be deposited inside of the contact window 8. In addition, the P-doped polysilicon films are easily etched by etching gases including at least one of F, Br and Cl. To enhance the conductivity of the first and second polysilicon films 7-A and 7-B, n-type dopants were introduced into the first and second polysilicon films 7-A and 7-B. In this embodiment, the n-type dopants were mixed in deposition gases when depositing the first and second polysilicon films 7-A and 7-B by a CVD technique, so that the n-type dopants were introduced into the first and second polysilicon films 7-A and 7-B during the growth thereof. Instead of using the above described method of introducing the dopants, a method may be used in which n-type dopants were introduced into the first and second polysilicon films 7-A and 7-B using ion implantation or $POCl_3$ diffusion after the first and second polysilicon films 7-A and 7-B containing no dopants have been deposited.

Figure 1E:
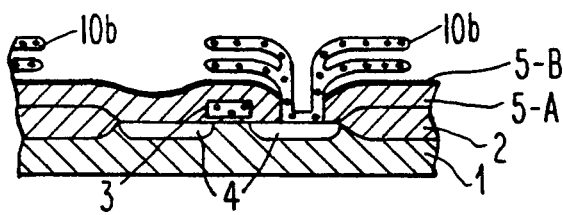
Figure 1F:
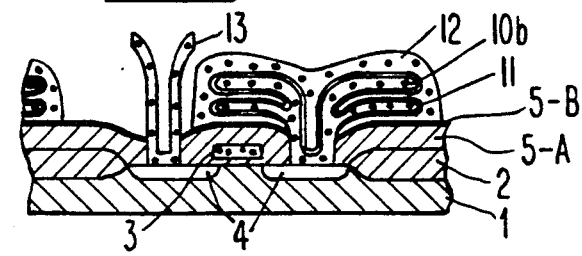

Next, the surface of the storage node 10a was etched by an isotropic etching technique, thereby rounding the edges of the storage node 10a. By this isotropic etching step, a storage node 10b having rounded edges was formed, as shown in FIG. 1E. In this embodiment, an ECR (Electron Cyclotron Resonance) method was used for the isotropic etching. The etching conditions were as follows: $SF_6$ gas flow was 50 sccm; a pressure was 7 Pa; and microwave power was 220 mA. The thickness of portions removed by the isotropic etching was about 30 nm. While $SF_6$ gas was used as an isotropic etching gas in this embodiment, other types of gases (e.g., $CH_4$, HBr, HCl and so on) including at least one of F, Br and Cl may be used. Alternatively, a wet etching using the hydrofluoric and nitric acid etching system may be used for the isotropic etching. Instead of the ECR method, other etching method, for example, a triodes method, a down flow method, or an RIE method may be used to etch and round the edges of the storage node 10a.

Next, a dielectric film 11 was formed on the storage node 10b. The dielectric film 11 was composed of an $SiO_2$ film (thickness; about 2 nm) formed on the surface of the storage node 10b and an SiN film (thickness: about 5 nm) deposited on the $SiO_2$ film by a low pressure chemical vapor deposition (LPCVD) technique. Then, a P-doped polysilicon film having a thickness of 200 nm was formed on the dielectric film 11 by an LPCVD technique. The P-doped polysilicon film was patterned to form a cell plate 12, thereby forming a storage capacitor as sown in FIG. 1F. After the storage capacitor was formed, a bit line 13 was formed to interconnect the switching transistor 50 to the periphery circuit.

Figure 9:
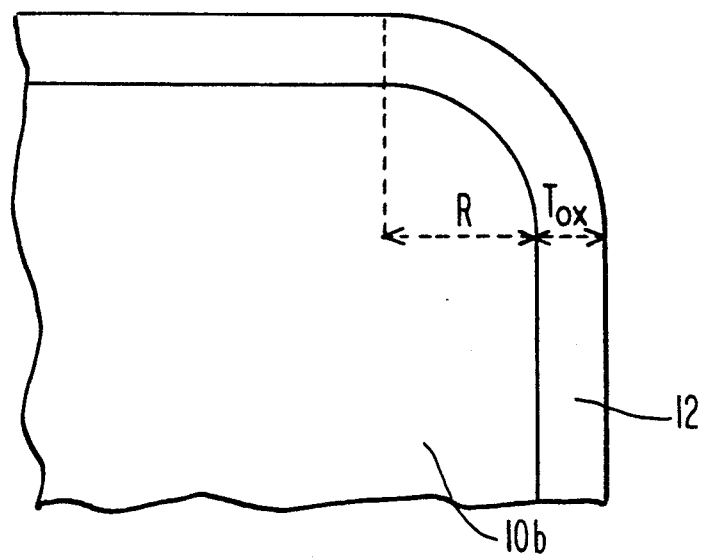
FIG. 9 shows a cross section of the rounded edge of the storage node 10$b$ of a semiconductor device according to the invention.
Figure 10:
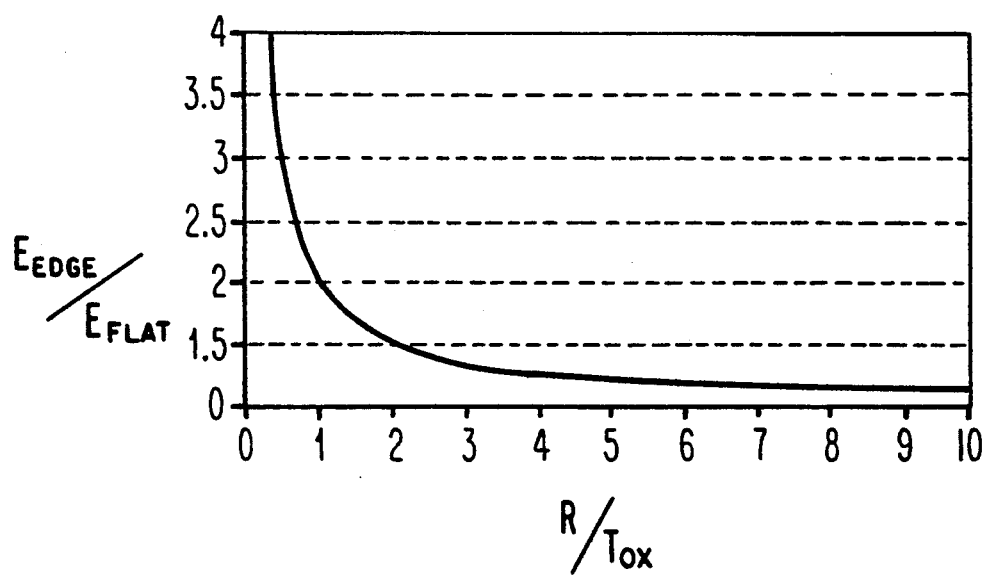
FIG. 10 shows the relationship between the radius (R) of curvature of a rounded edge normalized by the thickness ($T_{OX}$) of a dielectric film and the ratio ($E_{EDGE}/E_{FLAT}$) of the electric field strengths.

According to this embodiment, the surface of the storage node 10a was etched by an isotropic etching technique, thereby rounding the edges of the storage node 10a. The cross section of the rounded edge of the storage node 10b is schematically shown in FIG. 9. FIG. 10 shows the relationship between the radius (R) of curvature of the rounded edge normalized by the thickness ($T_{OX}$) of the dielectric film and the ratio ($E_{EDGE}/E_{FLAT}$) of the electric field strengths. This relationship was obtained by calculation.

In general, when a peak value of an electric field strength ($E_{EDGE}$) is set to be about 125% or less of an electric field strength in a flat region of the storage node 10 ($E_{FLAT}$), the breakdown of the dielectric film in the vicinity of the edges of the storage node is effectively prevented. Therefore, the ratio ($R/T_{OX}$) of the radius of curvature of the edge to the thickness of the dielectric film is preferably four or more.

In this embodiment, the number of fins of the storage node 10b was two. As the number of fins of the storage node 10b increases, the surface area of the storage node 10b increases, and consequently, the amount of electric charge that can be stored in one storage capacitor increases. According to the present invention, even though the number of fins of the storage node 10b and the number of the edges thereof are increased, breakdown of the dielectric film in the storage capacitor are effectively prevented.

EXAMPLE 2

Figure 2A:
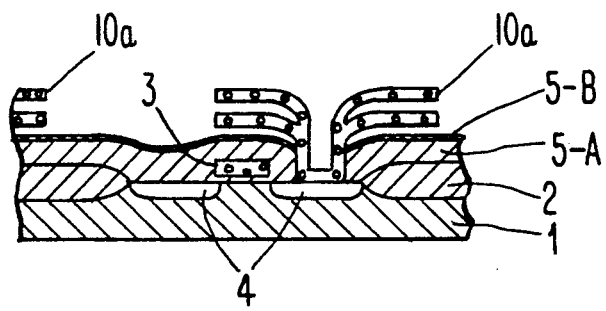
FIGS. 2A to 2C illustrate steps of fabricating another semiconductor device according to the invention.
Figure 2B:
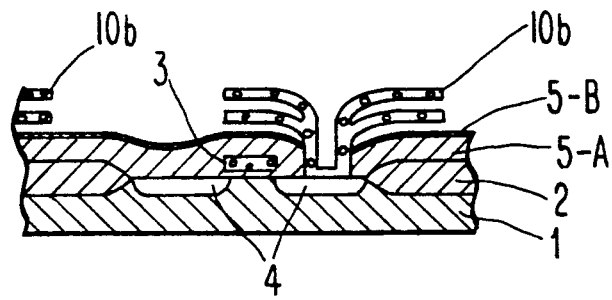
Figure 2C:
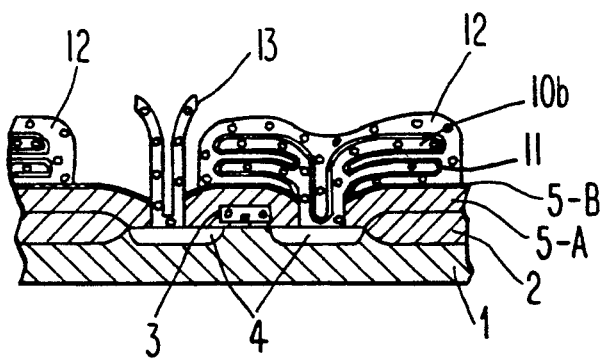

FIGS. 2A through 2C show a fabrication process sequence of another semiconductor device according to the invention. A structure formed by the process sequence shown in FIGS. 1A through 1D is shown in FIG. 2A. FIG. 2A corresponds to FIG. 1D.

After removing the resist pattern 9 (shown in FIG. 1C), an anisotropic etching step was conducted to round the edges of the storage node 10a. In this embodiment, conditions of the anisotropic etching process were as follows: a flow rate of HBr was 60 sccm; a flow rate of HCl was 20 sccm; gas pressures were 15 Pa; RF power was 150W. The thickness of portions removed by the isotropic etching was about 30 nm. In the anisotropic etching step, sputtering effects due to ion bombardments on the edges of the storage node 10a was used to round the edges of the storage node 10a. In order to sufficiently round the edges of the storage node 10a made of the P-doped polysilicon film, the above etching gas system was preferable because these etching gases can effectively react to silicon.

Next, a dielectric film 11 was formed on the surface of the storage node 10b. Then, a P-doped polysilicon film having was formed on the dielectric film 11 by an LPCVD technique. The P-doped polysilicon film was patterned to form a cell plate 12, thereby forming a storage capacitor shown in FIG. 2C. After the storage capacitor was formed, a formation of a bit line 13 was performed.

While the mixed gases including HBr and HCl were used to etch the storage node 10 in this embodiment, other type gases (e.g., $CH_4$, HBr, HCl and so on) including at least one of F, Br and Cl may be used. Alternatively, an inactive gas used for a sputtering gas may be used. Furthermore, etching methods other than the RIE method, for example, an ECR method with an application of a radio frequency wave, may be used.

According to this embodiment, the surface of the storage node 10a was etched by the anisotropic etching technique to round the edges of the storage node 10a, and the breakdown of the dielectric film 11 in the vicinity of the edges of the storage node was effectively prevented.

EXAMPLE 3

Figure 3A:
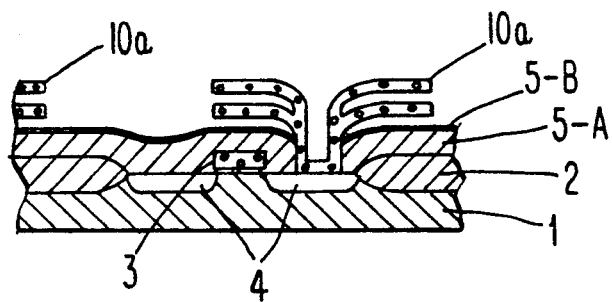
FIGS. 3A to 3C illustrate steps of fabricating another semiconductor device according to the invention.

FIGS. 3A through 3D show a fabrication process sequence of another embodiment according to the invention. A structure formed by the process sequence shown in FIGS. 1A through 1D is shown in FIG. 3A. FIG. 3A corresponds to FIG. 1D.

Figure 3B:
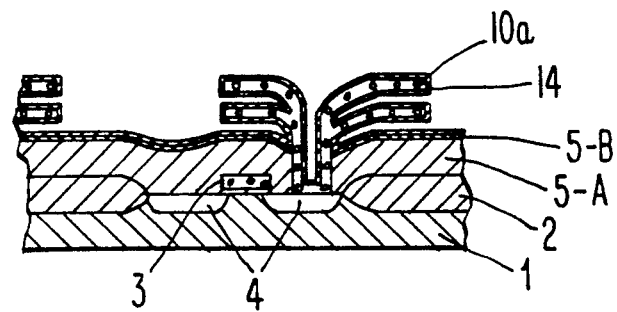

As shown in FIG. 3B, after a resist pattern 9 (shown in FIG. 1C) was removed, a third conductive film 14 was formed on the exposed surface of the storage node 10a. The third conductive film 14 used in this embodiment was a P-doped polysilicon (thickness: 30 nm) deposited by a CVD method. The deposition of the P-doped polysilicon film on the sharp edges of the storage node 10a occurred isotropically by the chemical vapor deposition method, and the P-doped polysilicon film covered the sharp edges of the storage node 10a (which serves as an inner conductive portion of a storage node 10b constituted by the storage node 10a and the third conductive film 14).

Figure 3C:
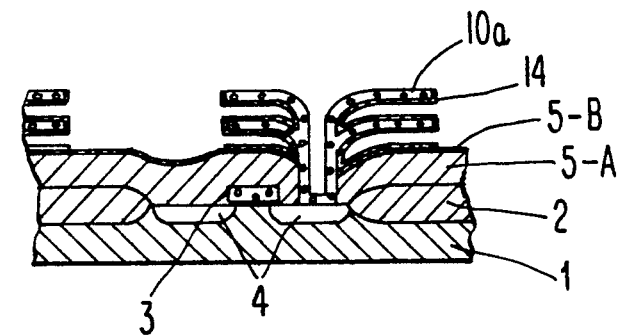
Figure 3D:
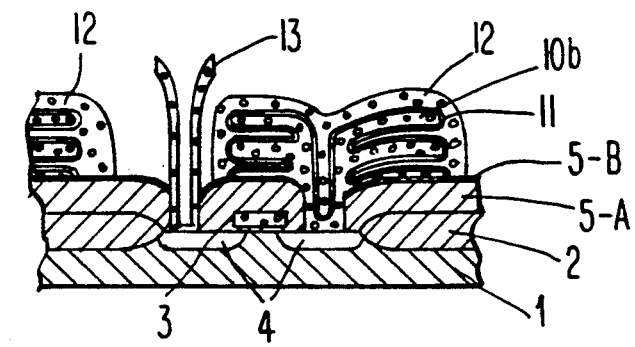

Next, as shown in FIG. 3C, the third conductive film 14 was etched back by an anisotropic etching technique without using a mask for a selective etching. This etch-back process removed portions of the third conductive film 14 on which ions of etching gases bombarded during the anisotropic etching, in order to isolate respective storage nodes, thereby forming the storage node 10b having rounded edges. Since the third conductive film was made of the same material as that of the second conductive film 7-B, the etching rate of the third conductive film 14 in the etch-back process step was equal to that of the second conductive film 7-B. Accordingly, steps having sharp edges were not formed at side portions of the second conductive film 7-B even when the third conductive film 14 was over-etched in the etch-back process.

Next, a dielectric film 11 was formed on the surface of the storage node 10b. Then, a P-doped polysilicon film was formed on the dielectric film 11 by an LPCVD technique. The P-doped polysilicon film was patterned to form a cell plate 12, thereby forming a storage capacitor shown in FIG. 3D. After the storage capacitor was formed, a formation of a bit line 13 was performed.

According to this embodiment, the surface of the storage node 10b was covered by the third conductive film 14 to round the edges of the electrode of the storage capacitor, and the breakdown of the dielectric film in the vicinity of the edges of the storage node 10b was effectively prevented.

While the third conductive film 14 was made of the same material as that of the second conductive film 7-B in this embodiment, the third conductive film 14 can be made of the material which is different from that of the second conductive film 7-B.

EXAMPLE 4

Figure 4A:
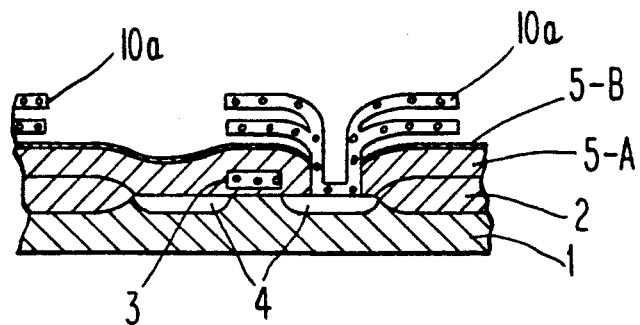
FIGS. 4A to 4D illustrate steps of fabricating another semiconductor device according to the invention.

FIGS. 4A through 4D show a fabrication process sequence of another embodiment according to the invention. A structure formed by the process sequence shown in FIGS. 1A though 1D is shown in FIG. 4A. FIG. 4A corresponds to FIG. 1D.

Figure 4B:
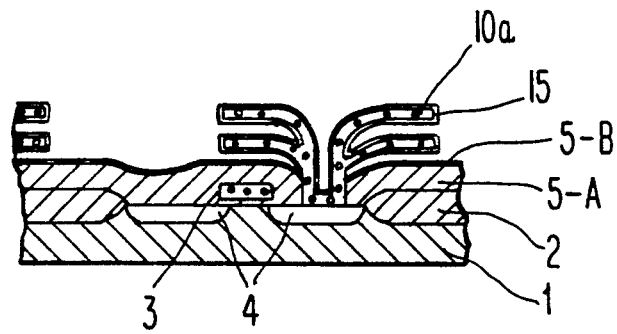
Figure 4C:
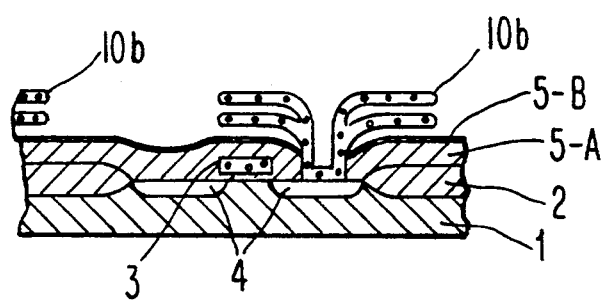
Figure 4D:
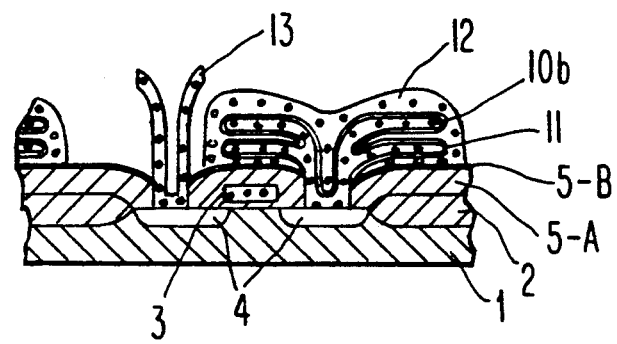
Figure 5A:
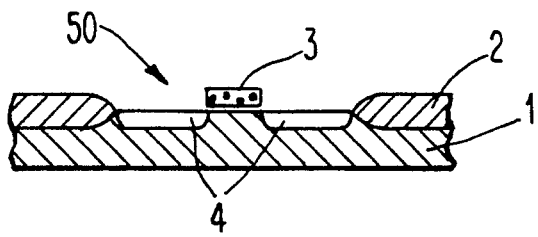
FIGS. 5A to 5E illustrate steps of fabricating a prior art semiconductor device.
Figure 5B:
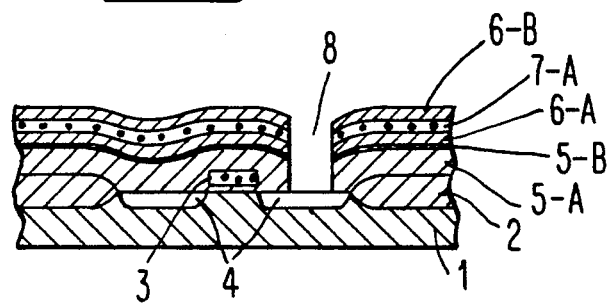
Figure 5C:
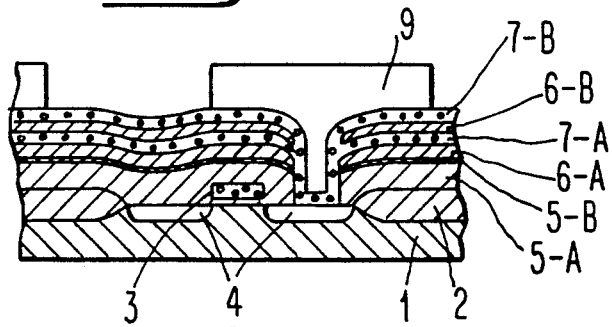
Figure 5D:
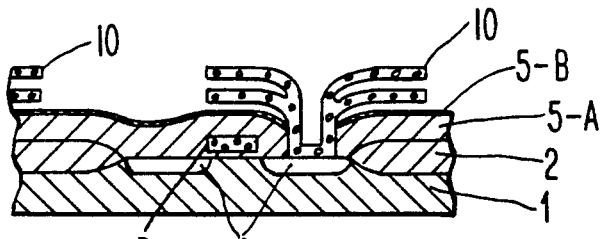
Figure 5E:
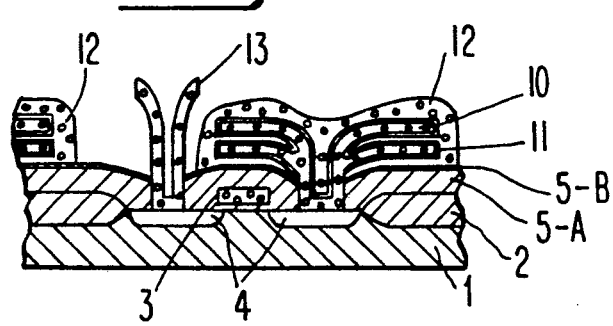
Figure 6A:
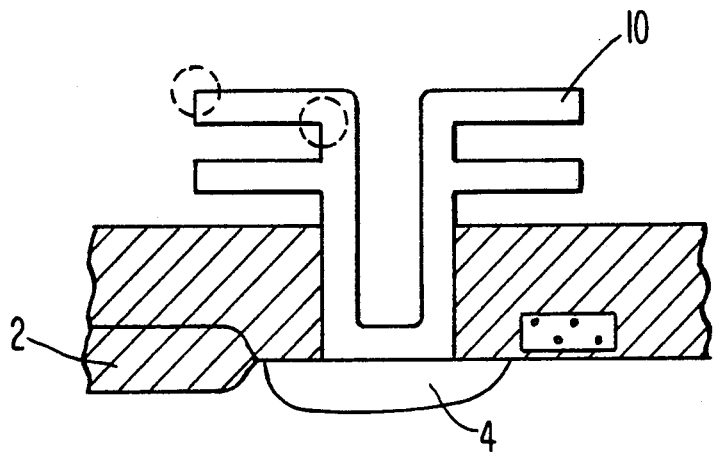
FIG. 6A shows a cross sectional view of a storage node in the prior art semiconductor device.
Figure 6B:
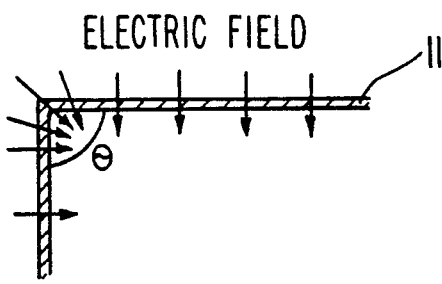
FIG. 6B schematically shows the electric field concentration in the vicinity of a shape edge of the storage node.
Figure 7:
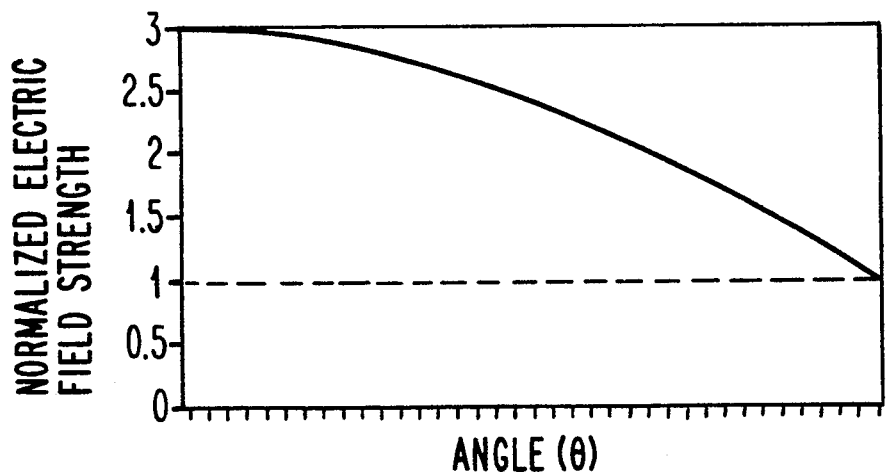
FIG. 7 shows a relationship between the ratio ($E_{EDGE}/E_{FLAT}$) of the electric field strengths and the angle ($\theta$) of a sharp edge.
Figure 8A:
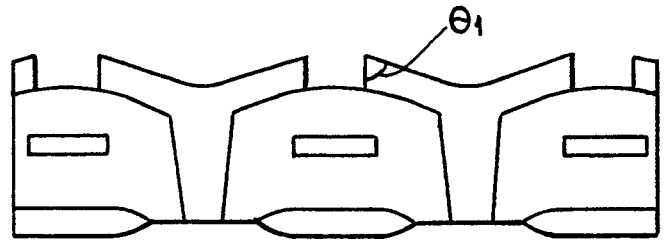
FIGS. 8A to 8C schematically show cross sectional features of the storage node in memory cells having different sizes.
Figure 8B:
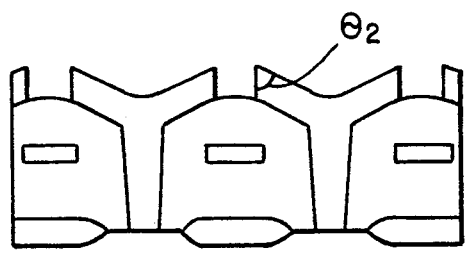
Figure 8C:
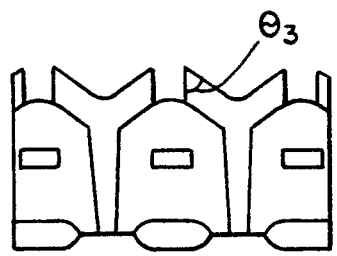

As shown in FIG. 4B, after a resist pattern 9 (shown in FIG. 1C) was removed, the surface of the storage node 10a was oxidized by a thermal oxidation process at the temperature of 1100° C., to form an oxide film 15 having a thickness of about 30 nm at the surface of the storage node 10a.

The hone effect did not occur during the thermal oxidation process, because the oxidation temperature was set to be 1100° C. The thermal oxidation at 1000° C. or more can form an oxide film in which the thickness of the oxide film in the vicinity of the edges of the storage node 10a was sufficiently thicker than the thickness of the oxide film in the flat regions of the storage node 10a.

After the oxide film 15 was removed by a wet etching technique using an HF etchant system, the storage node 10b having rounded edges was formed. Instead of using the wet etching technique, an isotropic plasma etching technique using a CHF$_3$ gas or others can be used for removing the oxide film 15.

Next, a dielectric film 11 was formed on the surface of the storage node 10b. Then, a P-doped polysilicon film was formed on the dielectric film 11 by an LPCVD technique. The P-doped polysilicon film was patterned to form a cell plate 12, thereby forming a storage capacitor shown in FIG. 1F. After the storage capacitor was formed, a formation of a bit line 13 was performed.

According to this embodiment, the surface of the storage node 10a was oxidized and etched to round the edges of the storage node 10b, and the breakdown of the dielectric film in the vicinity of the edges of the storage node 10b was effectively prevented.

Figure 11:
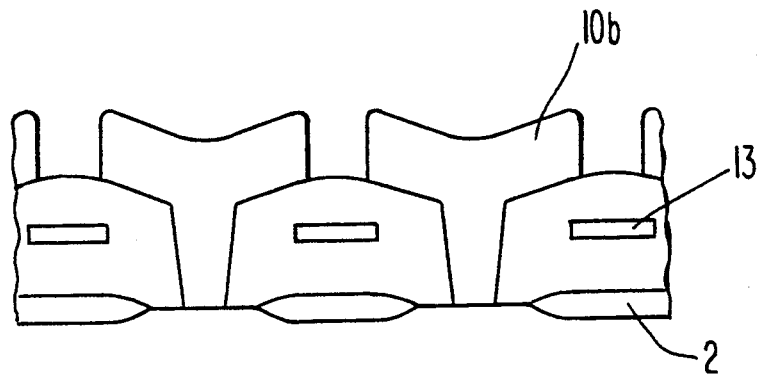
FIG. 11 illustrates another semiconductor device according to the invention.
Figure 12:
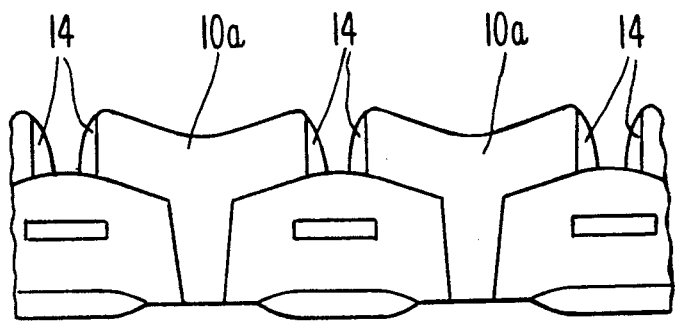
FIG. 12 illustrates another semiconductor device according to the invention.
Figure 13:
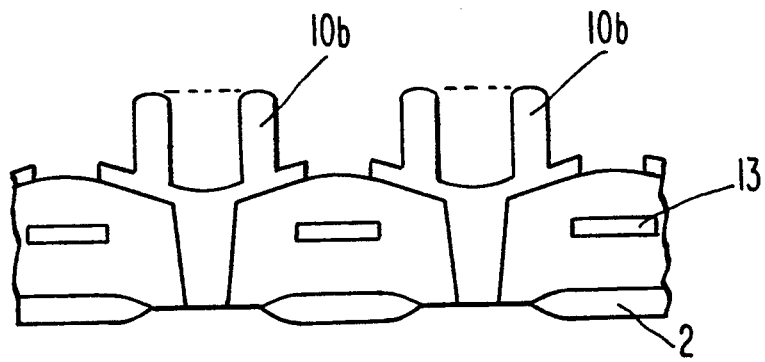
FIG. 13 illustrates another semiconductor device according to the invention.

While the invention has been described with reference to particular example embodiments of the semiconductor device in which a storage node has a fin structure, the invention can be applied to other types of storage node structures as well. For example, a conventional stacked type storage nodes 10b having no fin structure as shown in FIGS. 11 and 12, or a stacked capacitor having a circular cylinder structure as shown in FIG. 13. Furthermore, as materials of the storage node 10b, conductive materials other than the P-doped polysilicon for example, As-doped polysilicon or refractory metals such as a tungsten may be used.

It is understood that various other modification will be apparent to and can be readily made by those skilled in the art without departing from the scope and spirit of the invention. Accordingly, it is not intended the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor device comprising a semiconductor substrate having a top surface, and a plurality of memory cells formed on said top surface of said semiconductor substrate, each of said plurality of memory cells including a storage capacitor formed over said top surface of said semiconductor substrate;
   said storage capacitor comprising a first electrode having rounded edges in a cross section which is perpendicular to said top surface of said semiconductor substrate;
   a dielectric film formed on said first electrode, said dielectric film covering said rounded edges; and
   a second electrode formed on said dielectric film,
   said first electrode comprising an inner conductive portion; and a conductive film covering sad inner conductive portion, said rounded edges being made of said conductive film.

2. A semiconductor device according to claim 1, wherein the radius of curvature of said rounded edges is four or more times the thickness of said dielectric film.

3. A semiconductor device according to claim 1, wherein said conductive film of said first electrode is a film deposited on said inner conductive portion by a chemical vapor deposition method.

4. A semiconductor device according to claim 1, wherein said conductive film is a doped polycrystalline silicon film.

5. A semiconductor device comprising a semiconductor substrate having a top surface, and a plurality of memory cells formed on said top surface of said semiconductor substrate, each of said plurality of memory cells including a storage capacitor formed over said top surface of said semiconductor substrate;
   said storage capacitor comprising a first electrode having rounded edges in a cross section which is perpendicular to said top surface of said semiconductor substrate;
   a dielectric film formed on said first electrode, said dielectric film covering said rounded edges; and
   a second electrode formed on said dielectric film,
   said first electrode comprising a first conductive portion having side faces substantially perpendicular to said top surface of said semiconductor substrate; and a second conductive portion formed on said side faces of said first conductive portion.

6. A semiconductor device according to claim 5, wherein the radius of curvature of said rounded edges is four or more times the thickness of said dielectric film.

7. A semiconductor device according to claim 5, wherein said second conductive portion is deposited on said side faces of said first conductive portion by a chemical vapor deposition method.

8. A semiconductor device according to claim 5, wherein said conductive portion is a doped polycrystalline silicon film.

9. A method of fabricating a semiconductor device comprising a semiconductor substrate having a top surface, and a plurality of memory cells formed on said top surface of said semiconductor substrate, each of said plurality of memory cells including a storage capacitor formed over said top surface of said semiconductor substrate, said method comprising the steps of:
   forming a first electrode having rounded edges in a cross section which is perpendicular to said top surface of said semiconductor substrate;
   forming a dielectric film on said first electrode, for covering said rounded edges; and
   forming a second electrode on said dielectric film, thereby forming said storage capacitor which comprises said first electrode, said dielectric film, and said second electrode,
   said step of forming said first electrode comprising the steps of
      forming a multilayer structure over said top of said semiconductor substrate, said multilayer structure including at least one insulating film and conductive films sandwiching said insulating film;
      patterning said multilayer structure by a selective etching technique;
      removing said insulating film by an etching technique, for forming an electrode; and
      etching edges of said electrode by an etching technique, thereby forming said first electrode having said rounded edges.

10. A method of fabricating a semiconductor device comprising a semiconductor substrate having a top surface, and a plurality of memory cells formed on said top surface of said semiconductor substrate, each of said plurality of memory cells including a storage capacitor formed over said top surface of said semiconductor substrate, said method comprising the steps of:
   forming a first electrode having rounded edges in a cross section which is perpendicular to said top surface of said semiconductor substrate;

forming a dielectric film on said first electrode, for covering said rounded edges; and forming a second electrode on said dielectric film, thereby forming said storage capacitor which comprises said first electrode, said dielectric film, and said second electrode said step of forming said first electrode comprising the steps of forming a multilayer structure over said top of said semiconductor substrate, said multilayer structure including at least one insulating film and conductive films sandwiching said insulating film;

patterning said multilayer structure by a selective etching technique;

removing said insulating film by an etching technique, for forming an inner conductive portion of said first electrode; and forming a conductive film on said inner conductive portion, for covering said inner conductive portion, thereby forming said electrode having said rounded edges.

* * * * *

UNITED STATES PATENT AND TRADEMARK OFFICE
CERTIFICATE OF CORRECTION

PATENT NO. : 5,223,729
DATED : June 29, 1993
INVENTOR(S) : Kudoh et al.

It is certified that error appears in the above—identified patent and that said Letters Patent is hereby corrected as shown below:

In Claim 1, column 9, line 56 delete "sad" and insert --said--.

In column 2, line 34, delete "." after "850°C".

In column 5, line 60, delete "5-A" and insert "6-A".

In column 8, line 56, delete "." after "1100°C".

Signed and Sealed this

Twelfth Day of April, 1994

Attest:

BRUCE LEHMAN

Commissioner of Patents and Trademarks

Attesting Officer